(12) United States Patent
Ushiyama

(10) Patent No.: US 6,287,948 B1
(45) Date of Patent: Sep. 11, 2001

(54) SEMICONDUCTOR DEVICE AND METHOD FOR MAKING PATTERN DATA

(75) Inventor: Fumiaki Ushiyama, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/558,530

(22) Filed: Apr. 26, 2000

(30) Foreign Application Priority Data

Dec. 10, 1999 (JP) .................................................. 11-351914

(51) Int. Cl.$^7$ ....................... H01L 21/28; H01L 21/3205; H01L 21/44

(52) U.S. Cl. ........................... 438/606; 438/241; 438/462; 438/599; 438/622; 438/926; 257/296; 257/306; 257/572; 257/578; 257/773

(58) Field of Search ..................................... 438/606, 462, 438/210, 241, 275, 599, 928, 622, 926, 625; 716/12; 257/296, 306, 758, 752, 773

(56) References Cited

U.S. PATENT DOCUMENTS

| | | | |
|---|---|---|---|
| 4,882,289 | * 11/1989 | Moriuchi et al. | 438/241 |
| 5,396,100 | * 3/1995 | Yamasaki et al. | 257/390 |
| 5,459,093 | * 10/1995 | Kuroda et al. | 438/599 |
| 5,926,733 | * 7/1999 | Heo | 438/622 |
| 5,965,939 | * 10/1999 | Kim et al. | 257/752 |
| 6,023,099 | * 2/2000 | Komuro | 257/758 |
| 6,066,871 | * 5/2000 | Ema | 257/306 |

FOREIGN PATENT DOCUMENTS

| | | |
|---|---|---|
| 10-056-015 | 2/1998 | (JP) . |
| 10-335-333 | 12/1998 | (JP) . |
| 11-008-244 | 1/1999 | (JP) . |

OTHER PUBLICATIONS

Notification of Reason for Refusal—Tomohisa Tsuchiya, Examiner / Application No. 11–351941 / Drafting Date Jun. 16, 2000 / Hajime Inoue, et al.—applicant.

* cited by examiner

Primary Examiner—Matthew Smith
Assistant Examiner—Igwe U. Anya
(74) Attorney, Agent, or Firm—Hogan & Hartson, L.L.P.

(57) ABSTRACT

A semiconductor device has a first region, a second region and a border region between the first region and the second region. The semiconductor device has an interlayer dielectric layer, covering at least the first region and the second region. A first wiring layer is located in the first region and defines a relatively small pattern. A second wiring layer is located in the second region and defines a relatively large pattern that is wider than the small pattern. A first dummy pattern is formed in the first region and a second dummy pattern is formed in the border region. The interlayer dielectric layer includes a planarization silicon oxide film. The planarization silicon oxide film is one of a silicon oxide film formed by a polycondensation reaction between a silicon compound and hydrogen peroxide, an organic SOG (Spin On Glass) film an inorganic SOG film and a silicon oxide film formed by reacting an organic silane with ozone or water. The interlayer dielectric layer located over the first wiring layer is thinner than the interlayer dielectric layer located over the second wiring layer such that a global height difference occurs in the border region between the first region and the second region.

8 Claims, 11 Drawing Sheets

SEMICONDUCTOR DEVICE AND METHOD FOR MAKING PATTERN DATA

BACKGROUND OF THE INVENTION

1. Field of the Invention

The present invention relates to a semiconductor device and a method for making pattern data.

2. Description of Related Art

An interlayer dielectric layer provided in a semiconductor device has roles in insulating an upper wiring layer from a lower wiring layer, for example. If the interlayer dielectric layer does not have a flat surface, problems arise in that wiring layers formed on the interlayer dielectric layer may be cut.

Interlayer dielectric layers having an excellent planarization characteristic includes, for example, a silicon oxide film that is formed by reacting a silicon compound such as silane with hydrogen peroxide through a CVD method. For example, this technology is described in Japanese Laid-open Patent Application HEI 9-102492.

Although such a silicon oxide film is used as an interlayer dielectric layer, a global height difference is created along a border between a region in which large patterns of wiring layers are formed and a region in which small patterns of wiring layers are formed. More specifically, a main surface of a semiconductor substrate includes a region where relatively large patterns of wiring layers are formed and a region where smaller patterns of wiring layers are formed. The silicon oxide film has a high level of flowability. Accordingly, the silicon oxide film formed over the region where the small patterned wiring layers are formed typically has a thickness smaller than the thickness of the silicon oxide film formed over the region where the large patterned wiring layers are formed. Due to the thickness difference, a global height difference is created.

As the number of wiring layers increases, the number of interlayer dielectric layers increases. A difference in thickness occurs in each interlayer dielectric layer, and the thickness differences are added up. Accordingly, as the number of interlayer dielectric layers increases, the global height difference becomes greater.

Problems caused by greater global height differences are discussed below. When a through hole is formed in an interlayer dielectric layer, a resist is used. A focus margin in exposing the resist becomes smaller when the global height difference becomes larger. As a result, the resolution at the resist lowers. As a consequence, a designed shape of a through hole may not be formed or a through hole may not be formed at all.

SUMMARY OF THE INVENTION

It is an object of the present invention to provide a semiconductor device having a structure that is capable of reducing the global height difference and a method of making pattern data for the semiconductor device.

In accordance with one embodiment of the present invention, a semiconductor device has a global height difference in a border region between a first region and a second region. The semiconductor device comprises an interlayer dielectric layer, a first wiring layer, a second wiring layer, a first dummy pattern and a second dummy pattern. The first wiring layer is located in the first region and is formed from a small pattern. The second wiring layer is located in the second region and is formed from a relatively large pattern. The interlayer dielectric layer covers the first region and the second region. The interlayer dielectric layer includes a planarization silicon oxide film. The interlayer dielectric layer, located over the first wiring layer, has a thickness smaller than the thickness of the interlayer dielectric layer located over the second wiring layer such that the global height difference occurs in the border region between the regions. The first dummy pattern is formed in the first region, and the second dummy pattern is formed in the border region.

As a result, the first region and the border region can be formed into a condition that is equal to the condition in which the large pattern of wiring layer is located. For example, the pattern density in the first region where the smaller patterns are formed can be made generally equal to the pattern density in the second region where the larger patterns are formed because of the dummy pattern formed in the first region. Accordingly, the interlayer dielectric layer, covering the first region and the second region, can have generally the same thickness, and thus a smaller global height difference may be created in a semiconductor device. As a consequence, for example, a sufficient focus margin can be secured when a resist on an interlayer dielectric layer is exposed (for example, by a reduction projection exposure, an equal magnification (1:1) projection exposure or a scanning-type reduction projection exposure), and thus the resolution with respect to the resist is improved. Consequently, a through hole having a desired shape can be formed in an interlayer dielectric layer.

In accordance with one embodiment of the present invention, a large pattern has a width that is greater than the width of a small pattern. In a preferred embodiment, a large pattern may have a width ranging from several ten $\mu$m to several hundred $\mu$m, for example. A small pattern may have a width ranging from 0.1 $\mu$m to several $\mu$m.

In accordance with the present invention, a global height difference refers to a step difference that is created because the thickness of the interlayer dielectric layer located above the small pattern wiring layer is thinner than that of the interlayer dielectric layer located above the large pattern wiring layer.

In a semiconductor device in accordance with one embodiment of the present invention, for example, a minimum distance between the first wiring layer and the first dummy pattern, a minimum distance between the first wiring layer and the second dummy pattern and a minimum distance between the second wiring layer and the second dummy pattern, are respectively a minimum processible dimension for manufacturing the semiconductor device. On the other hand, a maximum distance between the first wiring layer and the first dummy pattern, a maximum distance between the first wiring layer and the second dummy pattern and a maximum distance between the second wiring layer and the second dummy pattern, are respectively a wiring layer width on a design rule for the semiconductor device.

The minimum distance is set to be a minimum processible dimension in manufacturing the semiconductor device because of the following reasons. The minimum processible dimension refers to a minimum dimension that can be obtained by the available semiconductor device manufacturing process and the semiconductor device manufacturing apparatus. A minimum distance between the first wiring layer and the first dummy pattern, a minimum distance between the first wiring layer and the second dummy pattern, and a minimum distance between the second wiring layer and the second dummy pattern may preferably be as small as possible, because the placement conditions of the regions where the first wiring layer, the first dummy pattern and the second dummy pattern are located become more similar to the placement condition of an area where the large pattern wiring layer is disposed. However, since these distances cannot be made shorter than a minimum processible dimension in manufacturing a semiconductor device, they are set to be a minimum processible dimension in manufacturing a semiconductor device.

The maximum distance is set to be a wiring layer width on a design rule for the semiconductor device because of the following reasons. As discussed above, the smaller the distance between a wiring layer and a dummy pattern becomes, the more the planarization effect improves. On the other hand, the greater the distance between a wiring layer and a dummy pattern becomes, the more the planarization effect deteriorates. When the maximum distance is set to be a wiring layer width on a design rule for the semiconductor device or less, patterns can be formed with sufficient focus margins without taking extraordinary measures, such as changing the design rule and the like.

In accordance with one embodiment of the present invention, the planarization silicon oxide film may preferably be any one of a silicon oxide film formed by a polycondensation reaction between a silicon compound and hydrogen peroxide, an organic SOG (Spin On Glass) film, an inorganic SOG film, and a silicon oxide film formed by reacting an organic silane with ozone or water.

A silicon oxide film may be formed by a polycondensation reaction between a silicon compound and hydrogen peroxide as follows.

The silicon oxide film described above may be formed by reacting a silicon compound and hydrogen peroxide utilizing a CVD method. As a result, the silicon oxide film becomes a planarized silicon oxide film. More specifically, the silicon oxide film formed by this manufacturing method has a high flowability and a high self-planarization characteristic. This phenomenon is believed to take place because of the following mechanism. When a silicon compound and hydrogen peroxide are reacted by a CVD method, silanol is formed in a vapor phase, and the silanol deposits on the surface of the wafer such that a film having a high flowability is formed.

For example, when monosilane is used as a silicon compound, silanol is formed by reactions defined by formulas (1) and (1)' as follows:

$SiH_4 + 2H_2O_2 \rightarrow Si(OH)_4 + 2H_2$     Formula (1)

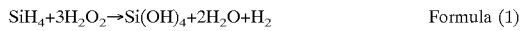

$SiH_4 + 3H_2O_2 \rightarrow Si(OH)_4 + 2H_2O + H_2$     Formula (1)

Silanol formed by the reactions defined by Formulas (1) and (1)' becomes silicon oxide as a result of disconnection of water by a polycondensation reaction defined by Formula (2) as follows:

$Si(OH)_4 \rightarrow SiO_2 + 2H_2O$     Formula (2)

The silicon compounds include, for example, inorganic silane compounds, such as monosilane, disilane, $SiH_2Cl_2$, $SiF_4$, and organo silane compounds, such as $CH_3SiH_3$, dimethylsilane, tripropyle-silane, tetraethylorthosilicate and the like.

Film-formation of the silicon oxide film may preferably be conducted by a reduced-pressure CVD method at temperatures of about 0–20° C., when the silicon compound is an inorganic silicon compound, and at temperatures of about 0–150° C., when the silicon compound is an organic silicon compound. If the temperature during the film-formation step is higher than the upper limit of the above-described temperature ranges, the polycondensation reaction defined by Formula (2) progresses excessively. As a result, the flowability of the silicon oxide film lowers and, therefore, it is difficult to obtain good planarization. On the other hand, if the temperature is lower than the lower limit of the above-described temperature ranges, the control of a film-forming apparatus becomes difficult. For example, adsorption of formed water content occurs within the chamber and dew condensation occurs outside the chamber.

The silicon oxide film formed by this method may preferably be formed with a thickness that sufficiently covers step differences of the underlying layer. The minimum thickness of the silicon oxide film depends on the height of protrusions and recesses of the underlying layer, and is preferably between about 300 and about 1500 nm. If the film thickness of the silicon oxide film exceeds the above-described upper limit, cracks may occur due to stresses of the film itself.

A semiconductor device, in accordance with one embodiment of the present invention, may have the following structure. For example, a logic circuit, analog circuit or a memory circuit is formed in the first region, and a bonding pad, a power source line or a test pattern is formed in the second region.

The first writing layers of small patterns can be used for wiring layers in a logic circuit, analog circuit and a memory circuit. On the other hand, a bonding pad itself, a power source line itself and a test pattern itself can be formed from the second wiring layers of large patterns.

In accordance with one embodiment of the present invention, a method is provided to generate pattern data for the first and second dummy patterns provided in the semiconductor device. The method for making pattern data comprises the steps of: generating pattern data for the first and second wiring layers; generating first expanded pattern data representing an expanded pattern of the first wiring layer only along a distance between the first wiring layer and the first dummy pattern and a distance between the first wiring layer and the second dummy pattern; generating second expanded pattern data representing an expanded pattern of the second wiring layer only along a distance between the second wiring layer and the second dummy pattern; and reversing the first and second expanded pattern data.

In the pattern data-generating method in accordance with the present embodiment, pattern data for the first and second wiring layers is used to generate pattern data for the first and second dummy patterns. As a result, the pattern data for the first and second dummy patterns can readily be obtained. Also, special CAD data is not required for generating the pattern data for the first and second dummy patterns.

Other features and advantages of the invention will be apparent from the following detailed description, taken in conjunction with the accompanying drawings which illustrate, by way of example, various features of embodiments of the invention.

DESCRIPTION OF PREFERRED EMBODIMENTS

Figure 1:
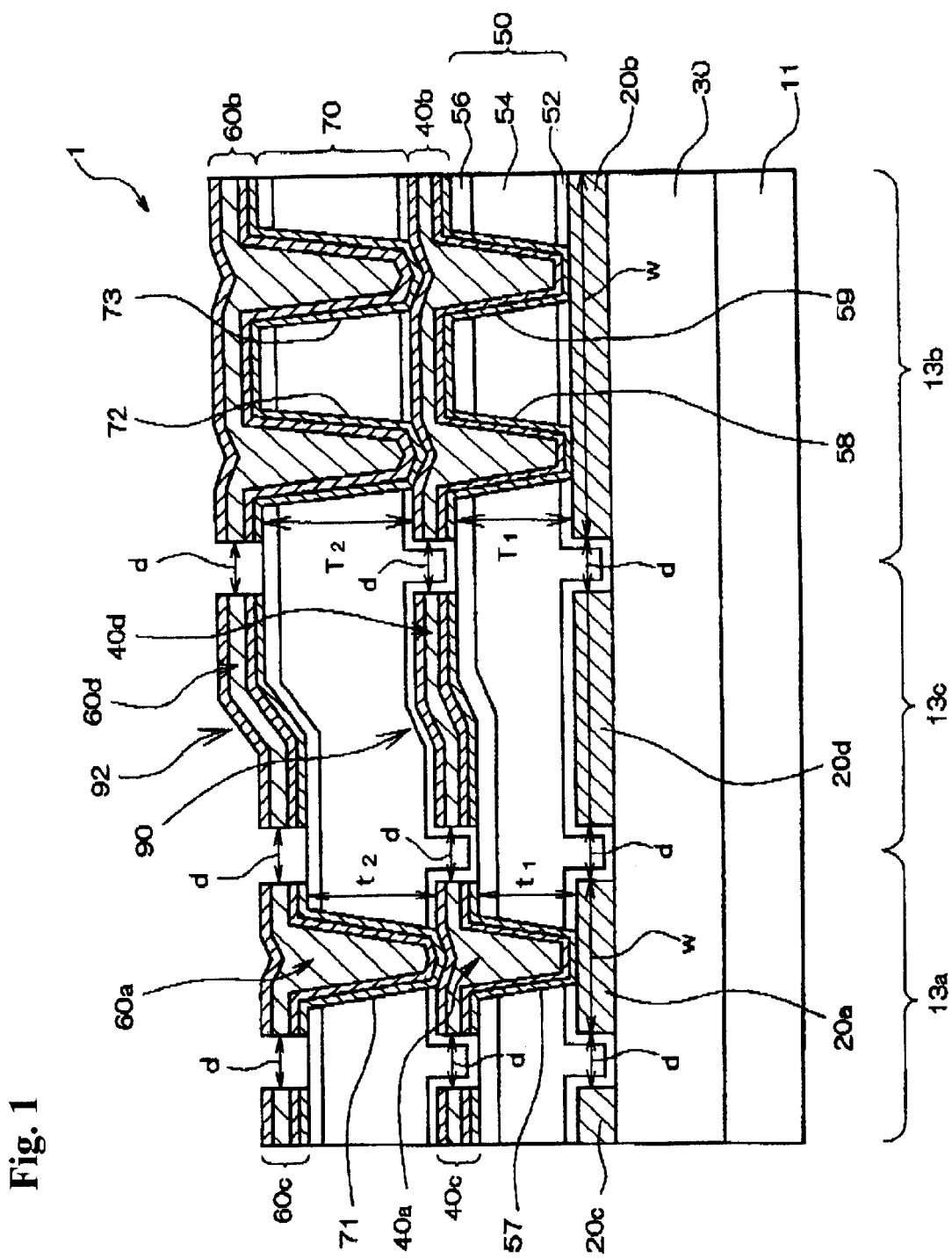
FIG. 1 is a cross-sectional view of a structure of a semiconductor device in accordance with one embodiment of the present invention.

FIG. 1 is a cross-sectional view of a structure of a semiconductor device 1 in accordance with a first embodiment of the present invention. The semiconductor device 1 has a silicon substrate 11, a first metal wiring layer in a first layer (first metal wiring layer 20a and first metal wiring layer 20b), a second metal wiring layer in a second layer (second metal wiring layer 40a and second metal wiring layer 40b), and a third metal wiring layer in a third layer (third metal wiring layer 60a and third metal wiring layer 60b). The structure of the semiconductor device 1 will be described below in greater detail.

The silicon substrate 11 has a main surface that includes a region 13a, a region 13b and a region 13c.

Metal wiring layers of small patterns are formed in the region 13a. Also, logic circuits and the like (not shown) are formed in the region 13a.

Metal wiring layers of large patterns are formed in the region 13b. Also, power source lines, bonding pads and the like (not shown) are formed in the region 13b.

The region 13c is located along a border between the region 13a and the region 13b. In the present embodiment, the region 13c is a border region.

An interlayer dielectric layer 30 is formed on the main surface of the silicon substrate 11 and covers the region 13a, the region 13b and the region 13c. The first metal wiring layer 20a, the first metal wiring layer 20b, a first layer dummy pattern 20c, and a first layer dummy pattern 20d are formed over the interlayer dielectric layer 30.

The first metal wiring layer 20a and the first layer dummy pattern 20c are located in the region 13a. The width w of the first metal wiring layer 20a is about 0.1 to several μm. The first metal wiring layer 20b is located in the region 13b. The width W of the first metal wiring layer 20b is about several ten μm to several hundreds μm. The first layer dummy pattern 20d is located in the region 13c.

An interlayer dielectric layer 50 is formed over the interlayer dielectric layer 30 and covers the first metal wiring layers 20a and 20b and the first dummy patterns 20c and 20d. The interlayer dielectric layer 50 has a three-layer structure.

In a preferred embodiment, a third silicon oxide film 52, serving as a base layer, is located at the bottom. A first silicon oxide film 54 is located on the third silicon oxide film 52. The first silicon oxide film 54 may preferably be formed by a polycondensation reaction between a silicon compound and hydrogen peroxide. In the present embodiment, the first silicon oxide film 54 serves as a planarized silicon oxide film. A second silicon oxide film 56, serving as a cap layer, is located on the first silicon oxide film 54.

As described above, the first silicon oxide film 54 itself has a high level of flowability. As a result, the thickness $t_1$, (for example, about 0.5–0.8 μm) of the interlayer dielectric layer located over the first metal wiring layer 20a of a small pattern becomes smaller than the thickness $T_1$, (for example, about 1.0–1.3 μm) of the interlayer dielectric layer 50 located over the first metal wiring layer 20b of a large pattern. As a consequence, a global height difference 90 is created in the region 13c.

A through hole 57 that reaches the first metal wiring layer 20a is formed in the interlayer dielectric layer 50. Also, through holes 58 and 59 that reach the first metal wiring layer 20b are formed in the interlayer dielectric layer 50. The through holes 57, 58 and 59 have the same aperture area.

The second metal wiring layer 40a, the second metal wiring layer 40b, a second layer dummy pattern 40c, and a second layer dummy pattern 40d are formed on the interlayer dielectric layer 50.

The second metal wiring layer 40a and the second layer dummy pattern 40c are located in the region 13a. The second metal wiring layer 40a is electrically connected to the first metal wiring layer 20a by a conductive film, including an aluminum film that fills in the through hole 57. The width of the second metal wiring layer 40a is generally the same as the width w of the first metal wiring layer 20a.

The second metal wiring layer 40b is located in the region 13b. The second metal wiring layer 40b is electrically connected to the first metal wiring layer 20b by a conductive film, including an aluminum film that fills in the through holes 58 and 59. The width of the second metal wiring layer 40b is generally the same as the width W of the first metal wiring layer 20b.

The second layer dummy pattern 40d is located in the region 13c.

An interlayer dielectric layer 70 is formed over the interlayer dielectric layer 50 and covers the second metal wiring layers 40a and 40b and the second dummy patterns 40c and 40d. The interlayer dielectric layer 70 has the same structure as that of the interlayer dielectric layer 50 and, therefore, a global height difference 92 is created in the region 13c.

A through hole 71 that reaches the second metal wiring layer 40a is formed in the interlayer dielectric layer 70. Also, through holes 72 and 73 that reach the second metal wiring layer 40b are formed in the interlayer dielectric layer 70. The through holes 71, 72 and 73 have generally the same aperture area.

The third metal wiring layer 60a, the third metal wiring layer 60b, a third layer dummy pattern 60c, and a third layer dummy pattern 60d are formed on the interlayer dielectric layer 70.

The third metal wiring layer 60a and the third layer dummy pattern 60c are located in the region 13a. The third metal wiring layer 60a is electrically connected to the second metal wiring layer 40a by a conductive film, for example, an aluminum film that fills in the through hole 71. The width of the third metal wiring layer 60a is generally the same as the width w of the first metal wiring layer 20a.

The third metal wiring layer 60b is located in the region 13b. The third metal wiring layer 60b is electrically connected to the second metal wiring layer 40b by a conductive film, including an aluminum film that fills in the through holes 72 and 73. The width of the third metal wiring layer 60b is generally the same as the width W of the first metal wiring layer 20b.

The third layer dummy pattern 60d is located in the region 13c.

A distance d between the first metal wiring layer 20a and the first layer dummy pattern 20c, a distance d between the first metal wiring layer 20a and the first layer dummy pattern 20d, a distance d between the first metal wiring layer 20b and the first layer dummy pattern 20d, a distance d between the second metal wiring layer 40a and the second layer dummy pattern 40c, a distance d between the second metal wiring layer 40a and the second layer dummy pattern 40d, a distance d between the second metal wiring layer 40b and the second layer dummy pattern 40d, a distance d between the third metal wiring layer 60a and the third layer dummy pattern 60c, a distance d between the third metal wiring layer 60a and the third layer dummy pattern 60d, and a distance d between the third metal wiring layer 60b and the third layer dummy pattern 60d are each about 0.5–1.0 μm. In the present embodiment, the same distance value d is provided for these distances. However, the present invention is not limited to this embodiment. These distance values may vary from one another.

In the semiconductor device 1, two interlayer dielectric layers (the interlayer dielectric layers 50 and 70) are provided. However, a semiconductor device in accordance with another embodiment of the present invention may have more than two interlayer dielectric layers. Alternatively, it may have a single interlayer dielectric layer.

Samples having dummy patterns are manufactured, and global height differences that occurred in the samples are measured to determine the effects created by the dummy patterns.

The samples are manufactured according to the following conditions. A plurality of rows of aluminum wirings are formed on a substrate. A distance d between adjacent aluminum wirings is changed from 0 μm to 5 μm at intervals of 1 μm. Each of the aluminum wirings has a width of 0.5 μm and a height of 0.7 μm. An interlayer dielectric layer is formed on the aluminum wirings to complete each sample. The interlayer dialectric layer has a three-layered structure consisting of a base layer, an intermediate layer and a cap layer. For example, the interlayer dielectric layer has the following structure:

Base layer: Silicon oxide film having a thickness of 0.3 μm;
Intermediate layer: Silicon oxide film having a thickness of 0.8 μm (formed by a polycondensation reaction between a silicon compound and hydrogen peroxide); and
Cap layer: Silicon oxide film having a thickness of 0.1 μm.

Cross-sections of the samples are photographed using an electron microscope, and global height differences are measured using the photographs.

Figure 2:
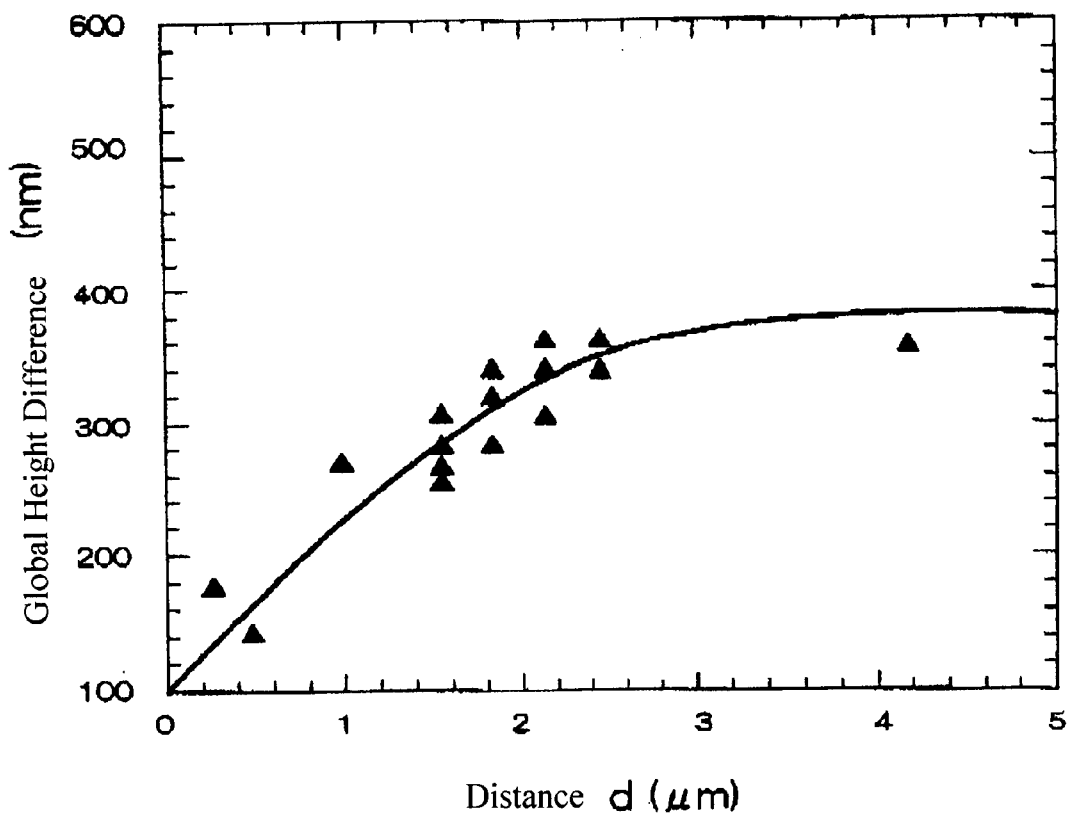
FIG. 2 is a graph representing relations between global height differences and distances (gaps) among wiring layers in sample semiconductor devices.

FIG. 2 is a graph showing relations between the distance d and global height differences. According to the graph, when the distance d is within a range that is less than about 3 μm, the global height difference becomes smaller as the distance d shortens.

The graph shows results in the case of one interlayer dielectric layer. Therefore, in the case of a plurality of interlayer dielectric layers, a global height difference is given by multiplying the result and the number of the interlayer dielectric layers. Consequently, a greater number of interlayer dielectric layers results in a greater global height difference. For example, when the distance d is 0.5 μm, and two interlayer dielectric layers are provided, a global height difference becomes 150 nm×2=300 nm.

The distance d is determined in consideration of the upper limit value of allowable global height differences, the number of interlayer dielectric layers, the focus margin, and the like.

As understood from FIG. 2, because the first layer dummy patterns 20c and 20d and the second layer dummy patterns 40c and 40d are provided in the regions 13a and 13c in the semiconductor device 1 shown in FIG. 1, the condition of the regions 13a and 13c is made equal to the condition where the large patterned metal wiring layers are located. For example, the pattern density in the regions 13a and 13c becomes generally equal to the pattern density in the regions where the large patterned metal wiring layers are located. Consequently, the thickness of the interlayer dielectric layers 50 and 70 is substantially prevented from being influenced by the size of the patterns of the wiring layers located below the interlayer dielectric layers. Therefore, in the semiconductor device 1, the global height differences 90 and 92 can be made smaller. As a consequence, for example, when a resist on the interlayer dielectric layers 50 and 70 is exposed (for example, by a reduction projection exposure, an equal magnification projection exposure or a scanning-type reduction projection exposure), a sufficient focus margin is obtained. Therefore, the resolution with respect to the resist is improved. Consequently, the through holes 57, 58, 59, 71, 72 and 73 can be formed in desired shapes in the interlayer dielectric layers 50 and 70.

When another interlayer dielectric layer is formed over the interlayer dielectric layer 70, a global height difference caused in the another interlayer dielectric layer can be made smaller by the third layer dummy patterns 60c and 60d.

Figure 3:
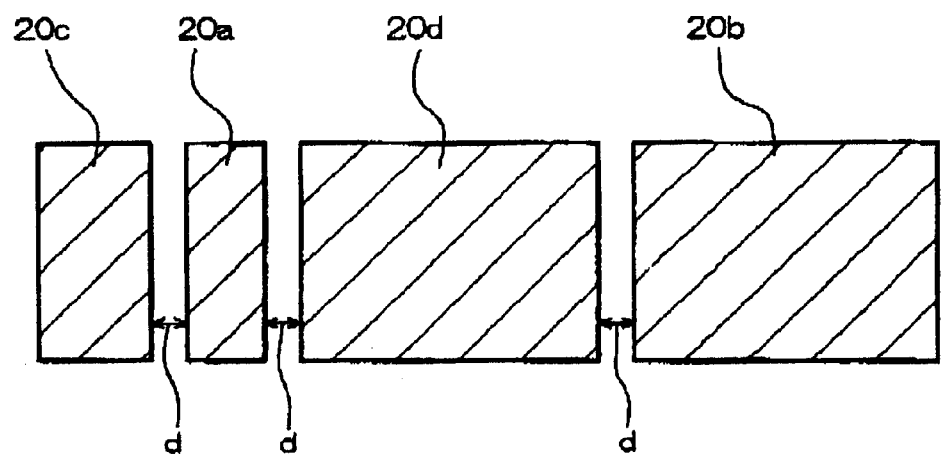
FIG. 3 is a plan view of first metal wiring layers and first dummy patterns provided in a semiconductor device in accordance with one embodiment of the present invention.

FIG. 3 is a plan view of the first metal wiring layers 20a and 20b and the first layer dummy patterns 20c and 20d provided in the semiconductor device 1 shown in FIG. 1. These layers are formed by steps, including a photolithography step. In the photolithography step, masks are used. The masks are designed by using a CAD. A method for generating mask data used for the mask design will be described below with reference to FIG. 4.

As shown in FIG. 4(A), first, pattern data 20a1 for the first metal wiring layer 20a and pattern data 20b1 for the first metal wiring layer 20b are created.

Referring to FIG. 4(B), the pattern data 20a1 is processed so that the pattern for the first metal wiring layer 20a is expanded in directions indicated by an arrow 3 and an arrow 5. Also, the pattern data 20b1 is processed so that the pattern for the first metal wiring layer 20b is expanded in a direction indicated by an arrow 7.

The arrow 3 points toward the location where the first layer dummy pattern 20c is placed. The pattern data 20a is processed so that the pattern of the first metal wiring layer 20a is expanded by a length in the direction indicated by the arrow 3 in the same amount as the distance d. The arrow 5 points toward the location where the first layer dummy pattern 20d is placed. The pattern data 20a1 is also processed so that the pattern for the first metal wiring layer 20a is also expanded by a length in the direction indicated by the arrow 5 in the same amount as the distance d. The arrow 7 points toward the location where the first layer dummy pattern 20d is placed. The pattern data 20b1 is processed so that the pattern for the first metal wiring layer 20b is expanded by a length in the direction indicated by the arrow 7 in the same amount as the distance d.

Figure 4:
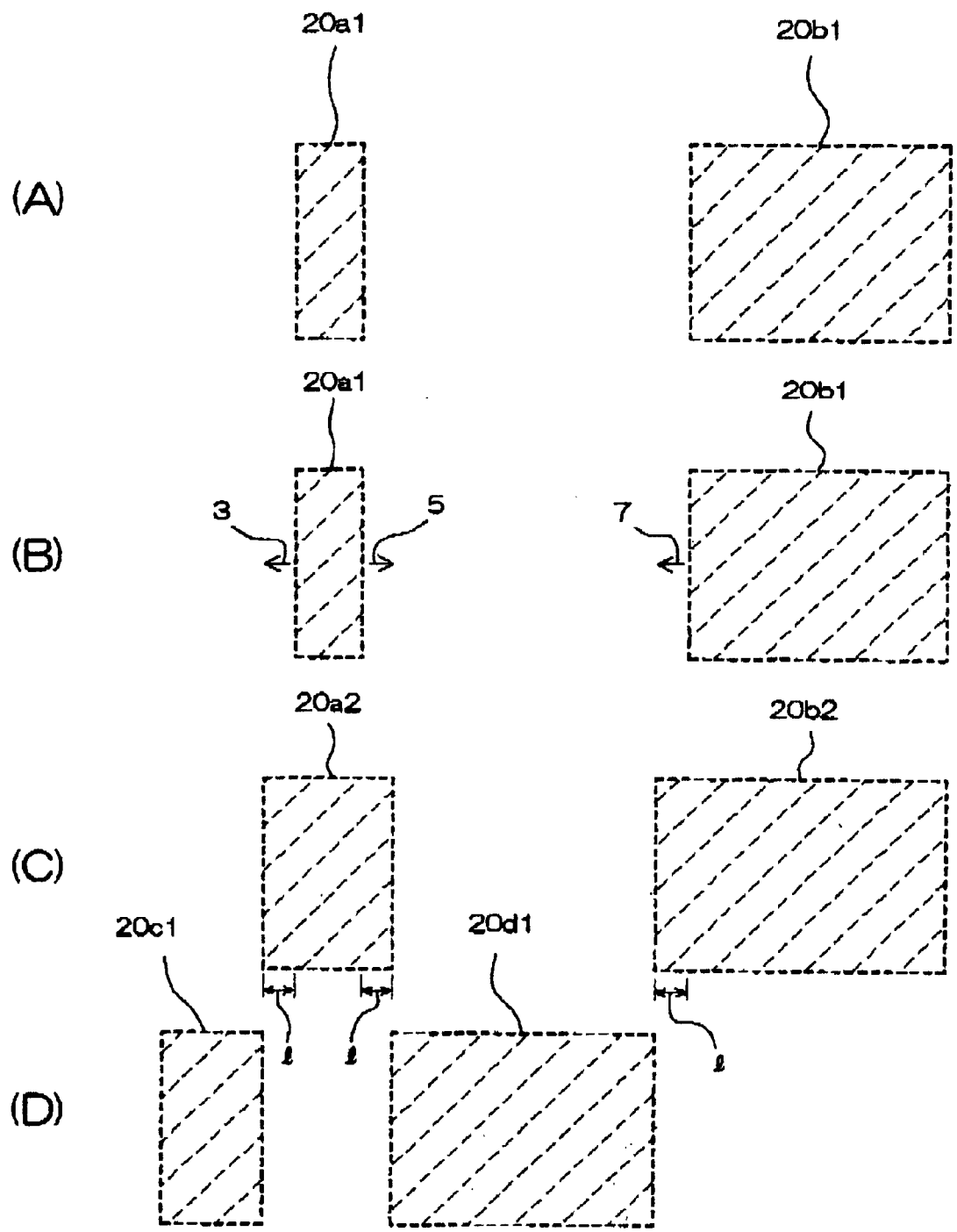
FIG. 4 is a process diagram that is used to describe a method for generating pattern data in accordance with one embodiment of the present invention.

In the manner described above, the pattern data 20a1 and the pattern data 20b1 are processed to obtain expanded pattern data 20a2 and expanded pattern data 20b2, respectively, as shown in FIG. 4 (C).

The expanded pattern data 20a2 is data that is obtained from the pattern data 20a1. The expanded pattern data 20a2 extends, as compared to the pattern data 20a1, by a length l in the direction toward the location where the first layer dummy pattern 20c is located, and also extends by a length l in the direction toward the location where the first layer dummy pattern 20d is located. The length l is the same as the distance d in a preferred embodiment of the present invention.

The expanded pattern data 20b2 is data that is obtained from the pattern data 20b1. The expanded pattern data 20b2 extends, as compared to the pattern data 20b1, by a length l in the direction toward the location where the first layer dummy pattern 20d is located. The length l is the same as the distance d in a preferred embodiment of the present invention.

Then, the expanded pattern data 20a2 and the expanded pattern data 20b2 are reversed to thereby obtain pattern data 20c1 for the first layer dummy pattern 20c and pattern data 20d1 for the first layer dummy pattern 20d, as shown in FIG. 4 (D).

As described above, in the pattern data-generating method in accordance with the present embodiment, the pattern data 20a1 for the first metal wiring layer 20a and the pattern data 20b1 for the first metal wiring layer 20b are used to generate the pattern data 20c1 for the first layer dummy pattern 20c and the pattern data 20d1 for the first layer dummy pattern 20d. Therefore, the pattern data 20c1 and the pattern data 20d1 are readily obtained. Also, special and independent CAD data is not required for generating the pattern data 20c1 and the pattern data 20d1.

Next, a method for manufacturing a semiconductor device 1 in accordance with one embodiment of the present invention will be described below. FIGS. 5–9 show cross sections of the semiconductor device used to describe manufacturing steps in the manufacturing process order.

Figure 5:
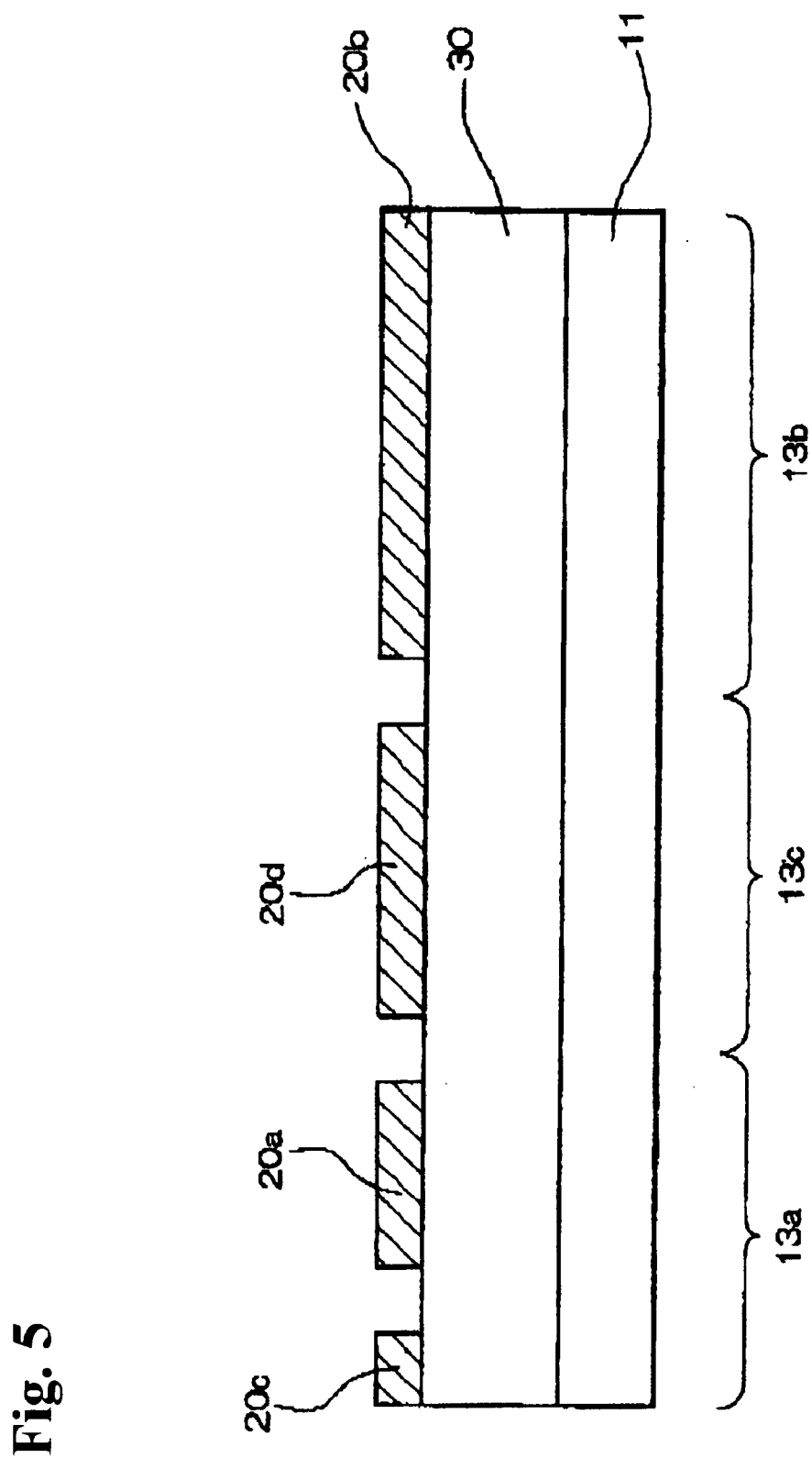
FIG. 5 shows a first step in a process for manufacturing a semiconductor device in cross section in accordance with one embodiment of the present invention.

FIG. 5 shows a silicon substrate 11 having a main surface. An electronic device element such as a MOS field-effect transistor is formed on the main surface. For example, an interlayer dielectric layer 30, such as a silicon oxide film, is formed on the main surface of the silicon substrate 11 by a CVD method. Known film-forming conditions can be employed for forming the silicon oxide film. The interlayer dielectric layer 30 may have a single-layer structure or a multiple-layer structure.

A metal layer, including, for example, an aluminum film, is formed on the interlayer dielectric layer 30 by a sputtering method, for example. The metal layer is patterned by photolithography and an etching, for example. As a result, a first metal wiring layer 20a and a first layer dummy pattern 20c are formed in a region 13a. A first metal wiring layer 20b is formed in a region 13b. A first layer dummy pattern 20d is formed in a region 13c.

The first metal wiring layers 20a and 20b and the first layer dummy patterns 20c and 20d may have a single-layer structure or a multiple-layer structure.

Figure 6:
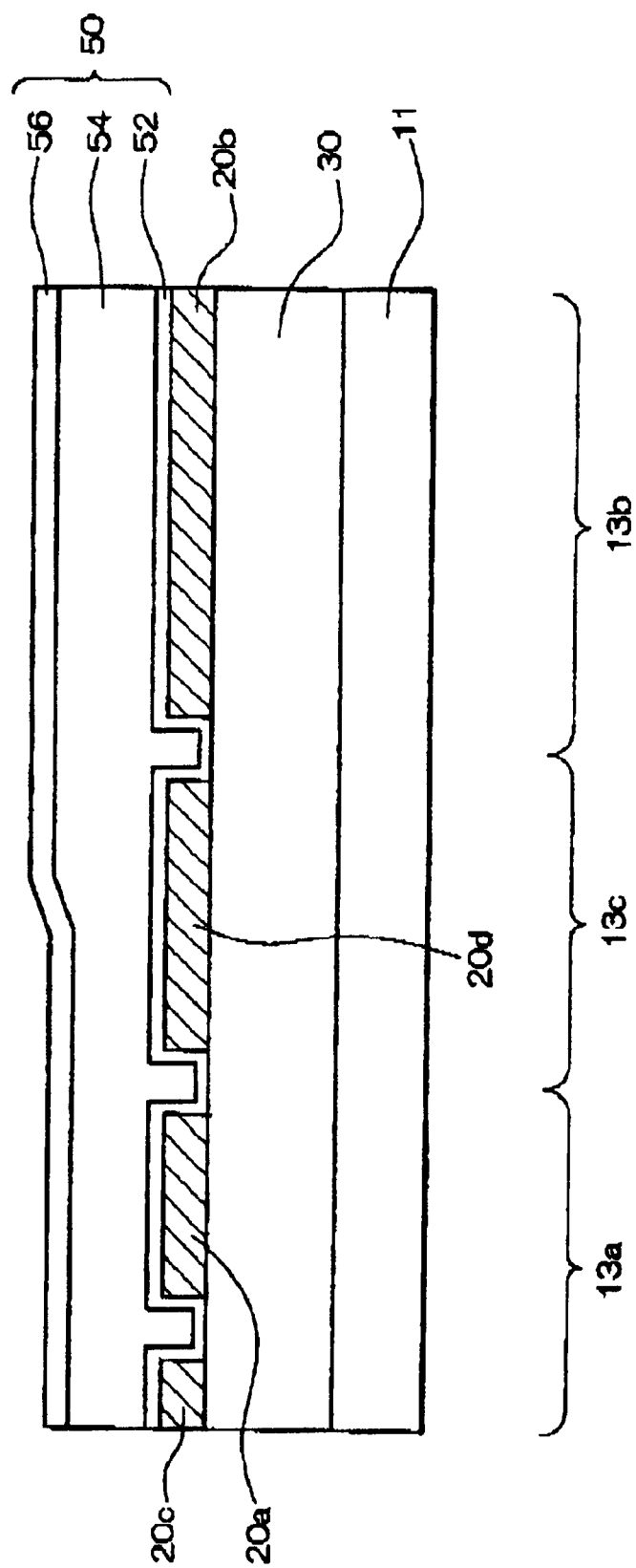
FIG. 6 shows a second step in the process for manufacturing the semiconductor device in cross section in accordance with the one embodiment of the present invention.

As shown in FIG. 6, a third silicon oxide film 52, having a film thickness of about 50–200 nm, is formed by a reaction between tetraethylorthosilicate (TEOS) and oxygen at temperatures of about 300–500° C., utilizing a plasma CVD method. The silicon oxide film 52 does not have cuspings and does not oxidize the first metal wiring layers 20a and 20b and the first dummy patterns 20c and 20d. The silicon oxide film 52 has a greater insulation, a slower etching speed against a hydrogen fluoride solution, and a higher density than a film that is grown from $SiH_4$.

As shown in FIG. 6, a first silicon oxide film 54 is formed by a CVD method through a reaction between $SiH_4$ and $H_2O_2$, using nitrogen gas as a carrier, under a reduced pressure of about $2.5 \times 10^2$ Pa or lower, in accordance with a preferred embodiment, and more preferably about $0.3 \times 10^2$–$2.0 \times 10^2$ Pa. The first silicon oxide film 54 has a film thickness that is greater than at least a step difference in the third silicon oxide film 52. In other words, the first silicon oxide film 54 is formed to have a film thickness that sufficiently covers the step difference. A maximum film thickness of the first silicon oxide film 54 is set such that cracks are not generated in the film. For example, the film thickness of the first silicon oxide film 54 is preferably greater than a step difference in the underlying layer to achieve an optimum planarization, and may preferably be in a range between about 300 and about 1500 nm.

Film formation temperature of the first silicon oxide film 54 depends on its flowability during the film formation thereof. A high film formation temperature lowers the flowability of the film and deteriorates the planarization. Accordingly, in a preferred embodiment, the film formation temperature is set at about 0–20° C., and more preferably at about 0–10° C.

The flow quantity of $H_2O_2$ is not particularly restricted to a specified level. However, for example, the flow quantity of $H_2O_2$ may preferably be set at a value equivalent to a concentration ratio of about 55–65 volume % and twice or more as that of $SiH_4$. In one embodiment, for example, the flow quantity of $H_2O_2$ is preferably set at a gas flow rate ranging from 100 to 1000 SCCM, in consideration of the uniformity of films and the throughput.

The first silicon oxide film 54 formed in this step is in the form of silanol polymer, has a high level of flowability, and a high level of self-planarization characteristic. Also, the first silicon oxide film 54 has a high level of moisture absorption capability due to numerous hydroxyl (—OH) contained therein.

Next, the substrate is left in the chamber under a reduced pressure for 30–120 seconds to remove some water content from the first silicon oxide film 54, and then in succession thereto, a plasma CVD is conducted with the presence of $SiH_4$, $PH_3$ and $N_2O$ gases at temperatures of about 300–450° C. at high frequencies of about 200–600 kHz. As a result, the gases react with one another and form a PSG film (second silicon oxide film) 56, having a film thickness of about 100–600 nm, as shown in FIG. 6. In a preferred embodiment, the second silicon oxide film 56 is formed in succession to the film formation of the first silicon oxide film 54 in consideration of high moisture absorption capability of the first silicon oxide film 54. Alternatively, the second silicon oxide film 56 may be formed after the first silicon oxide film 54 is reserved in an atmosphere that does not contain water.

The second silicon oxide film 56 needs to be porous such that gasification components, such as water, hydrogen and the like contained in the first silicon oxide film 54, are readily and thoroughly removed in an anneal treatment that is later performed. Accordingly, the second silicon oxide film 56 is preferably formed by a plasma CVD method at a frequency of 1 MHz or lower and more preferably at a frequency of 200–600 kHz, and at temperatures of 450° C. or lower and more preferably at temperatures of 300–400° C. Also, in a preferred embodiment, the second silicon oxide film 56 contains an impurity such as phosphorous. When the second silicon oxide film 56 contains such an impurity, the second silicon oxide film 56 becomes more porous, with the result that stresses of the film are alleviated, and the film obtains a gettering effect with respect to alkali ions. The level of concentration of the impurity is determined in consideration of the gettering effect and resistance to stresses. For example, when phosphorous is added as an impurity, the concentration level thereof may preferably be set at 2–6 weight %.

Also, $N_2O$ is used as a compound containing oxygen in the plasma CVD. The use of $N_2O$ promotes separation of hydrogen bonds in the first silicon oxide film 54. As a result, gasification components such as water and hydrogen contained in the first silicon oxide film 54 are removed more securely.

This film thickness of the second silicon oxide film 56 is determined in consideration of its role in adjusting the required thickness of the interlayer dielectric layer and the function of $N_2O$ plasma that promotes separation of hydrogen bonds. In a preferred embodiment, the second silicon oxide film 56 may have a film thickness of about 100 nm or greater and more preferably a film thickness of about 200–600 nm.

Referring to FIG. 6, an anneal treatment is conducted in a nitrogen atmosphere at temperatures of about 350–500° C. By this anneal treatment, the first silicon oxide film 54 and the second silicon oxide film 56 are densified and have good insulation and water-resistance characteristics. When the annealing temperature is set at 350° C. or higher, polycondensation reaction of silanol in the first silicon oxide film 54 is almost perfectly completed, such that water and hydrogen contained in the film are sufficiently discharged and the film is densified. When the annealing temperature is set at 500° C. or lower, aluminum films that form the first metal wiring layers 20a and 20b are not deteriorated. The annealing temperature is preferably set as high as allowable. This is because (1) the insulation capability of the interlayer dielectric layer is improved and (2) the interlayer dielectric layer becomes more resistive to deteriorating effects of heat treatments that are performed at later stages.

In the anneal treatment, the wafer temperature is gradually elevated continuously or in stages in order to reduce effects of thermal strains against the first silicon oxide film 54. In other words, a ramping anneal is preferably conducted.

If the interlayer dielectric layer 50 is located between the main surface of the silicon substrate 11 and the layer where the first metal wiring layers 20a and 20b and the first dummy patterns 20c and 20d are formed (at a position where the interlayer dielectric layer 30 is formed), the anneal treatment can be conducted at temperatures higher than 500° C., because an aluminum wiring is not formed below the interlayer dielectric layer 50.

By the above-described steps, the interlayer dielectric layer 50 that includes the first silicon oxide film 54, the second silicon oxide film 56 and the third silicon oxide film 52 is completed.

Figure 7:
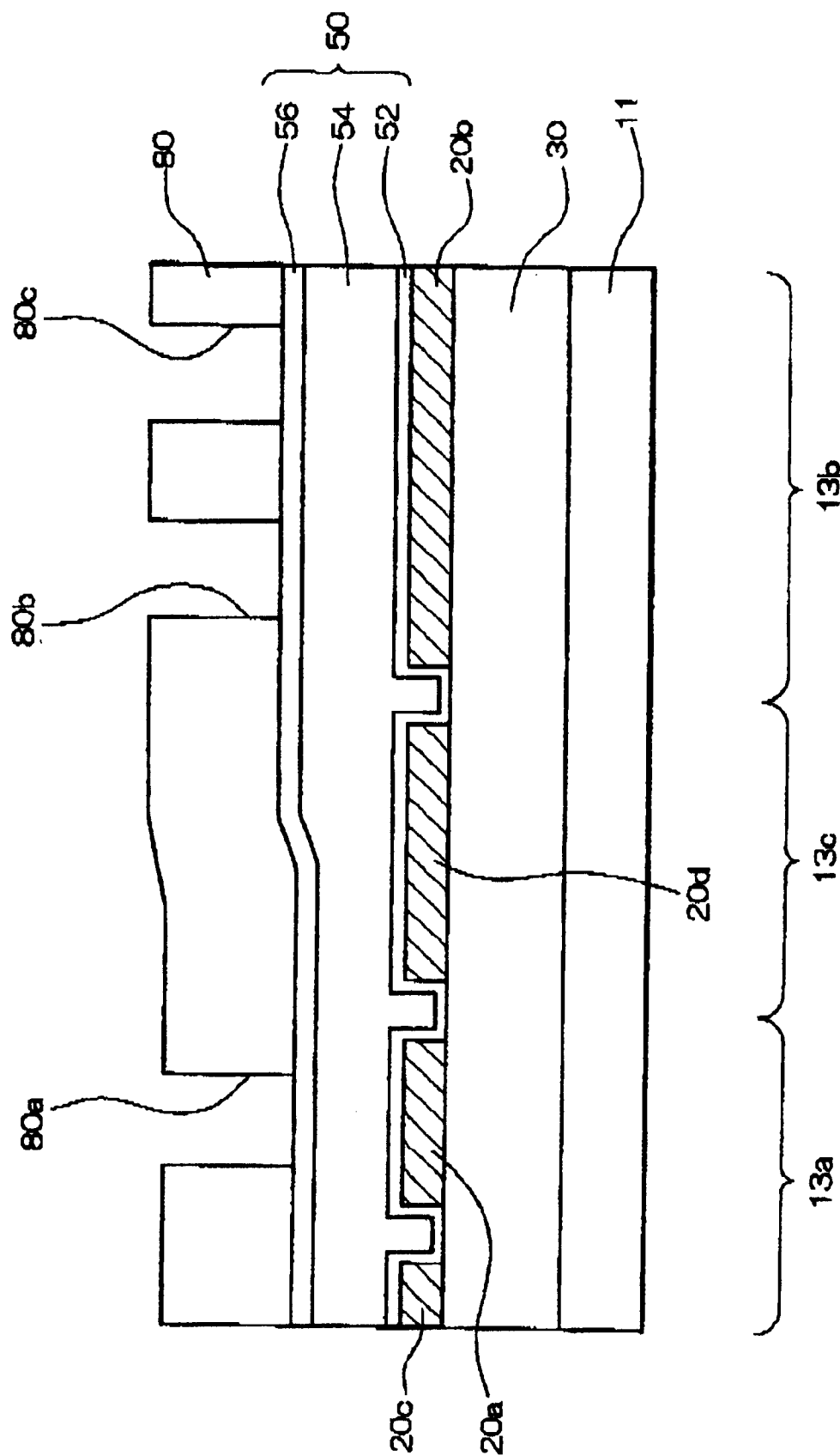
FIG. 7 shows a third step in the process for manufacturing the semiconductor device in cross section in accordance with the one embodiment of the present invention.

As shown in FIG. 7, a resist 80 is formed on the interlayer dielectric layer 50. Then, the resist 80 is selectively exposed by a reduction projection exposure. The resist 80 is developed to form a pattern locally having hole portions 80a, 80b and 80c. The hole portions 80a, 80b and 80c have the same aperture diameter.

The hole portion 80a is located in the region 13a. A through hole is formed under the hole portion 80a. The hole portions 80b and 80c are located in the region 13b. Through holes are formed under the hole portions 80b and 80c.

Figure 8:
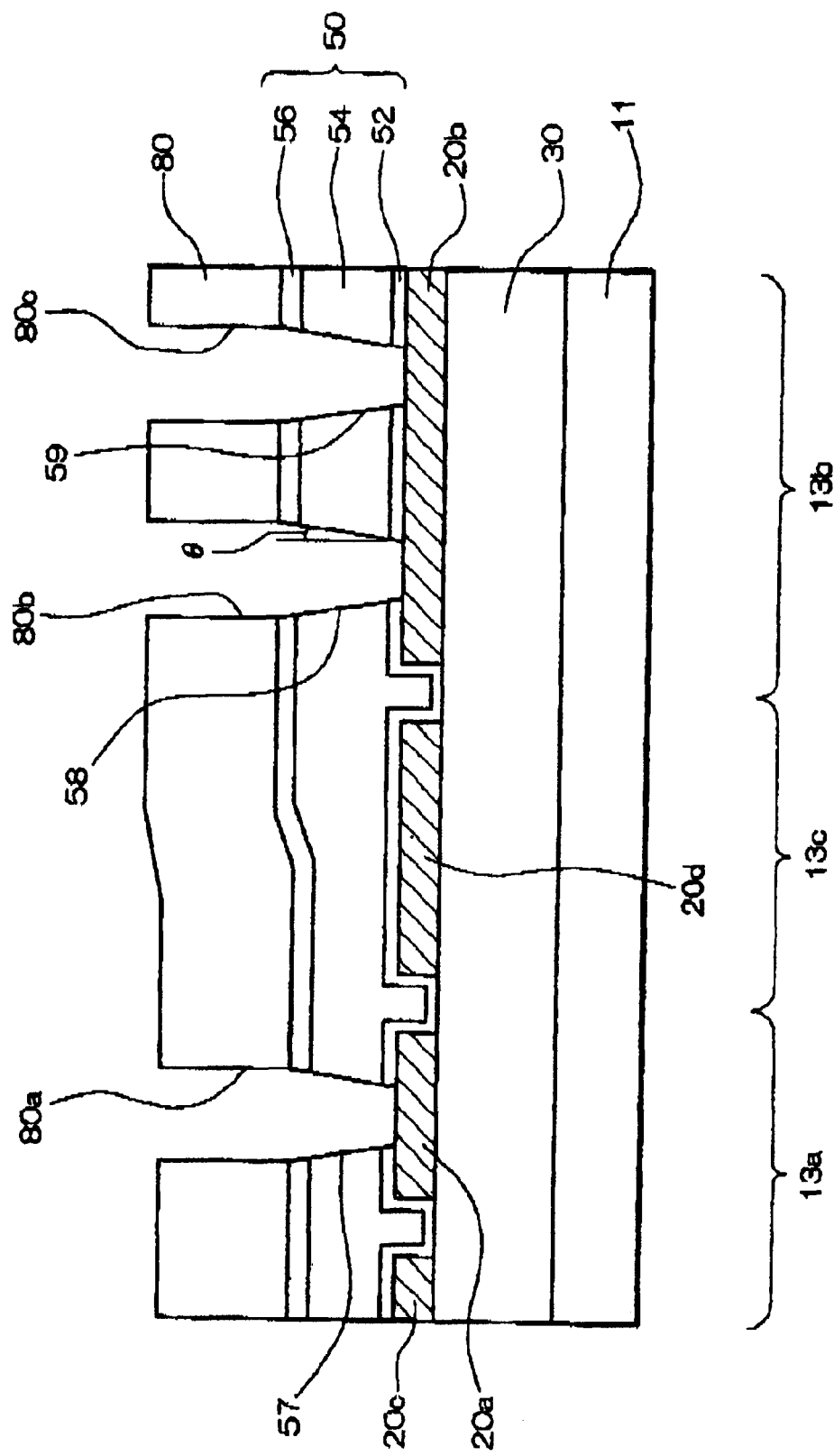
FIG. 8 shows a fourth step in the process for manufacturing the semiconductor device in cross section in accordance with the one embodiment of the present invention.

Referring to FIG. 8, the first silicon oxide film 54, the second silicon oxide film 56 and the third silicon oxide film 52 that form the interlayer dielectric layer 50 arc selectively anisotropically etched, using a reactive ion etcher containing $CHF_3$ and $CF_4$ as main gases. As a result, a through hole 57 that reaches the first metal wiring layer 20a is formed, and through holes 58 and 59 that reach the first metal wiring layer 20b are formed.

Each of the through holes 57, 58 and 59 has a tapered side surface in which cross sections of the through holes linearly reduce from their opening sections toward bottom sections. The tapered side surface of each through hole is angled at a taper angle θ with respect to a vertical line. The taper angle θ may vary, depending on etching conditions, However, for example, the taper angle θ is preferably 5–15 degrees. Such tapered through holes are formed by the following reasons. First, the first silicon oxide film 54, the second silicon oxide film 56 and the third silicon oxide film 52 present generally the same etching speed. However, the first silicon oxide film 54 presents an etching speed slightly slower than that of the second silicon oxide film 56. Secondly, boundary surfaces of the silicon oxide films are bonded to each other very well. Aluminum films can be deposited very well in such tapered through holes, as described below.

Dry etching speeds for the silicon oxide films, measured by the inventors of the present invention, are shown below. The dry etching is performed with a power being 800 W, a pressure being 20 Pa and etchant gases containing $CF_4$, $CHF_3$ and He in a ratio of 1:2:9.

| First silicon oxide film 54 | 525 nm/min |
| Second silicon oxide film 56 | 550 nm/min |
| Third silicon oxide film 52 | 500 nm/min |

A heat treatment, including a degasification process, will be described below.

Lamp heating (heat treatment A) is conducted in a lamp chamber under base pressures of about $1.5 \times 10^{-4}$ Pa or lower, at temperatures of about 150–350° C., and more preferably at temperatures of about 150–250° C., for about 30–60 seconds. Then, in another chamber where argon gas is introduced at pressures of about $1 \times 10^{-1} – 15 \times 10^{-1}$ Pa, a heat treatment (degasification step: heat treatment B) is conducted at temperatures of about 300–500° C. for about 30–300 seconds to thereby perform a degasification process.

In this process, first, the entire wafer, including its rear surface and side surface, is heat treated in the heat treatment A to remove water content that adheres to the wafer, as a primary object.

Then, in the heat treatment B, mainly, gasification components ($H$, $H_2O$) in the first silicon oxide film 54 that forms the interlayer dielectric layer 50 are removed. As a result, generation of gasification components from the interlayer dielectric layer 50 can be prevented during film formation of a barrier layer and an aluminum film conducted in later steps.

In accordance with an embodiment of the present invention, a wetting layer, such as for example, a Ti film, may be formed. Such film contains several ten atom % of gasification components (O, H, $H_2O$, N) in a solid solution. Accordingly, removal of the gasification components in the interlayer dielectric layer 50 before forming the wetting layer is very effective in successfully forming aluminum films in the through holes 57, 58 and 59. Unless the gasification components are sufficiently removed from the interlayer dielectric layer 50 below the wetting layer, the gasification components in the interlayer dielectric layer 50 may be discharged and enter the wetting layer at a film formation temperature for forming the wetting layer (normally 300° C. or higher). Further, the gases are separated from the wetting layer when an aluminum film is formed and come out into a boundary between the wetting layer and the aluminum film, causing deteriorating effects on cohesiveness and flowability of the aluminum layer.

Figure 9:
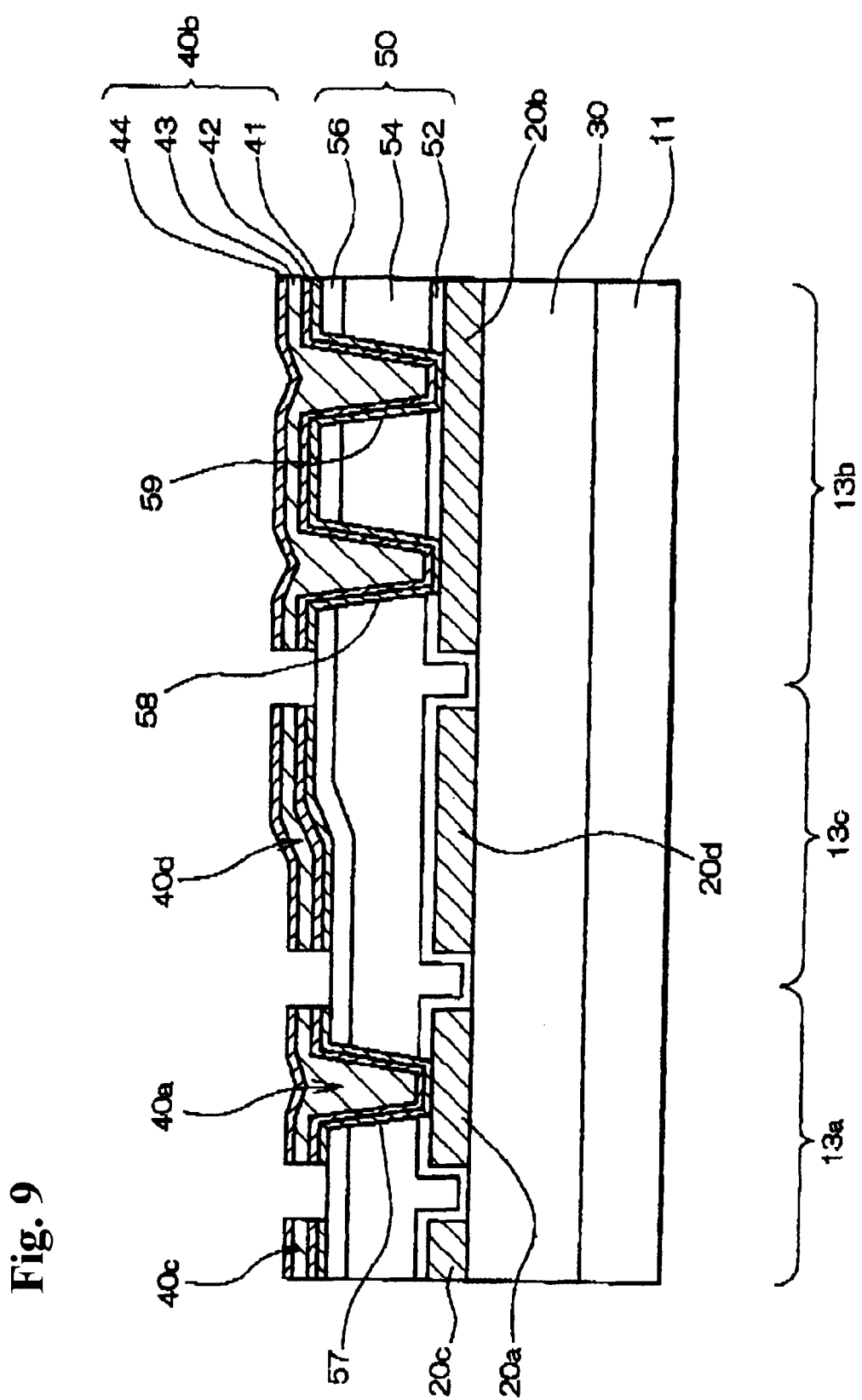
FIG. 9 shows a fifth step in the process for manufacturing the semiconductor device in cross section in accordance with the one embodiment of the present invention.

Referring to FIG. 9, a titanium film, serving as a wetting layer 41, is formed to a film thickness of about 20–70 nm by a sputtering method. The sputtering is conducted at temperatures ranging between about 200 and about 450° C., depending on the film thickness.

Before cooling the wafer, a heat treatment (heat treatment C) is conducted in a lamp chamber under base pressures of about $1.5 \times 10^{-4}$ Pa or lower at temperatures of about 150–250° C. for about 30–60 seconds to remove substances such as water adhered to the substrate. Then, before an aluminum film is formed, the substrate temperature is lowered to 100° C. or lower, and more preferably to the normal temperature (room temperature) –50° C. This cooling process is important to lower the temperature of the substrate that has been heated up through the heat treatment C. For example, the wafer is placed on a stage equipped with a water cooling function to cool the wafer to a predetermined temperature.

By cooling the wafer in the manner described above, the amount of gases which may be discharged from the interlayer dielectric layer 50, the wetting layer 41 and the entire surface of the wafer at the time of film formation of a first aluminum film 42 is reduced to a minimum. As a result, this prevents deteriorating effects of the gases which may be adsorbed on the boundary between the wetting layer 41 and the first aluminum film 42 to thereby damage their coverage and cohesiveness.

Referring to FIG. 9, first, a first aluminum film 42 is formed by sputtering aluminum containing about 0.2–1.0 weight % copper at a high speed at temperatures of about 200° C. or lower, and more preferably at about 30–100° C. to a film thickness of about 150–300 nm. Then, the substrate temperature is elevated to about 420–460° C. in the same chamber, and aluminum similarly containing copper is sputtered at a low speed to form a second aluminum film 43 having a film thickness of about 300–600 nm. In this film formation step, the level of "high speed" for film formation of the aluminum films may vary depending on the film-forming condition and design specifications of a device to be manufactured. However, in this embodiment, the term "high speed" refers to sputtering speeds of about 10 nm/second or faster, and the term "low speed" refers to sputtering speeds of about 3 nm/second or slower.

Figure 10:
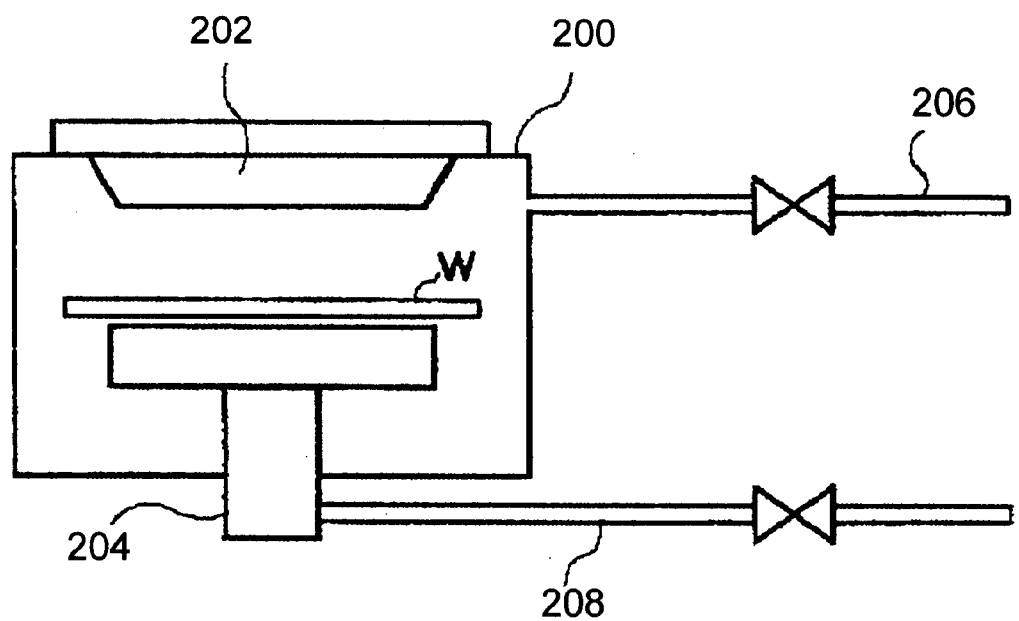
FIG. 10 schematically shows an example of a sputter apparatus used for the process for manufacturing the semiconductor device in accordance with one embodiment of the present invention.

FIG. 10 schematically shows an example of a sputter apparatus that is used to form the first and second aluminum films 42 and 43. The sputter apparatus has a chamber 200, a target 202, functioning also as an electrode, and an electrode 204, functioning as a stage. A substrate (wafer) W to be processed is mounted on the electrode 204. A first gas supply channel 206 is connected to the chamber 200, and a second gas supply channel 208 is connected to the electrode 204. Both the gas supply channels 206 and 208 supply argon gas. The temperature of the wafer W is controlled by a gas, supplied through the second gas supply channel 208. An exhaust system (not shown) may be provided to exhaust gases from the chamber 200.

Figure 11:
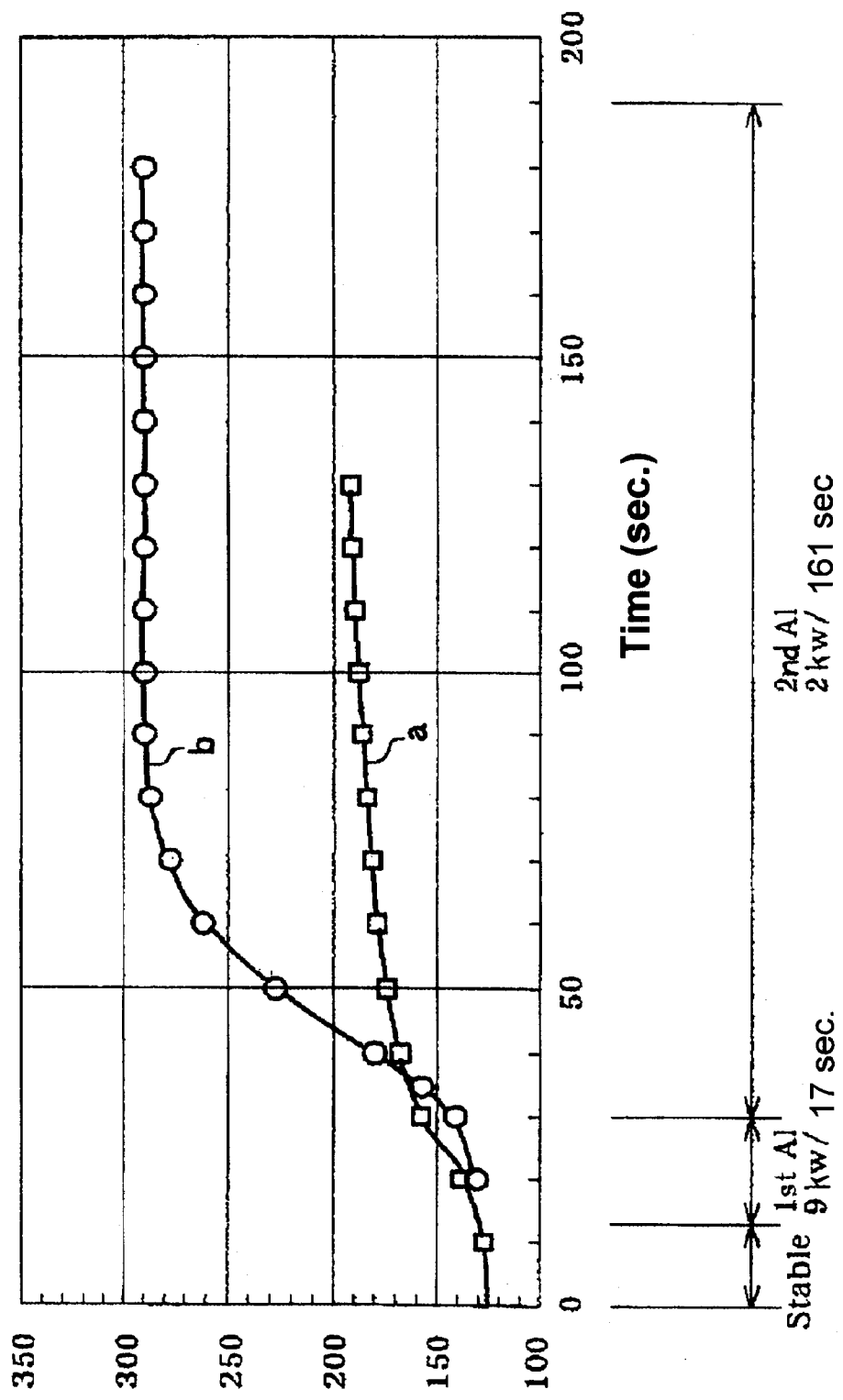
FIG. 11 shows relations between elapsed time and substrate temperatures when the substrate temperature is controlled using the sputter apparatus shown in FIG. 10.

One example for controlling the substrate temperature by the sputter apparatus is illustrated in FIG 11. In FIG. 11, elapsed time is presented along the axis of abscissa, and substrate (wafer) temperatures are presented along the axis of ordinate. In FIG. 11, a line marked by reference "a" represents changes in the substrate temperature when the stage 204 of the sputter apparatus is set at 350° C. A line marked by reference "b" represents changes in the substrate temperature when the temperature of the stage 204 is increased by supplying high temperature argon gas through the second gas supply channel 208 into the chamber.

For example, the substrate temperature is controlled as follows. The stage 204 is pre-heated and its temperature is set at a film-forming temperature for forming the second aluminum film (e.g., at about 350–500° C.). When the first aluminum film is formed, the substrate temperature is gradually increased by the heat of the stage 204 without gas supply from the second gas supply channel 208, as indicated by the line marked by reference "a" shown in FIG. 11. When the second aluminum film is formed, the substrate temperature is controlled to rapidly elevate by supplying heated gas through the second gas supply channel 208, and to be stabilized at a predetermined temperature level, as indicated by the line marked by reference "b" shown in FIG. 11.

In the example shown in FIG. 11, the temperature of the stage is set at 350° C., and the first aluminum film 42 is formed while the substrate temperature is set at 125–150° C.; and immediately thereafter, the film formation of the second aluminum film 43 is conducted.

In the process of forming the aluminum films, control of power applied to the sputtering apparatus is important, as well as control of film-forming speed and substrate temperature. In other words, the first aluminum film 42 is formed with a higher power, and the second aluminum film 43 is formed with a lower power. Most importantly, the power should not be reduced to zero when the power is switched from the higher power to the lower power. If the power is reduced to zero, an oxide film is formed on the surface of the first aluminum film even under a reduced pressure; and the wettability of the second aluminum film with respect to the first aluminum film is lowered, and bonding between the films is deteriorated. In other words, by continuously applying power, active aluminum is continuously supplied onto the surface of the aluminum film during the film formation and formation of an oxide film is suppressed. The level of power is preferably set at 5–10 kW for the high power and at 300 W–1 kW for the lower power, for example, under the temperature condition shown in FIG. 11, although it may vary depending on the sputtering apparatus and film-forming conditions.

By successively forming the first aluminum film 42 and the second aluminum film 43 in the same chamber, the temperature and the power can be precisely controlled and stable aluminum films are effectively formed at a lower temperature than the conventional method.

The thickness of the first aluminum film 42 is selected to be in an appropriate range in consideration of the capability of forming successive layers with good step coverage and the capability of controlling discharge of gasification components from the wetting layer 41 and the interlayer dielectric layer 50 below the first aluminum film 42.

For example, the thickness of the first aluminum film 42 may preferably be about 100–300 nm. The thickness of the second aluminum film 43 is determined by factors such as the size of a through hole and its aspect ratio. For example, the thickness of about 300–800 nm is necessary to cover a through hole smaller than 0.5 µm in diameter with aspect ratio of about 3.

Further, referring to FIG. 9, an antireflection film 44 with a film thickness of about 30–80 nm is formed by sputter-depositing titanium nitride (TiN) in another sputter chamber.

Then, a multiple-layer, that is composed of the wetting layer 41, the first aluminum film 42, the second aluminum film 43 and the antireflection film 44, is selectively etched by an anisotropic dry etching apparatus, using an anisotropic dry etcher mainly containing $Cl_2$ and $BCl_3$ gases. As a result, a second metal wiring layer 40a and a second layer dummy pattern 40c are formed in the region 13a, a second metal wiring layer 40b is formed in the region 13b, and a second layer dummy pattern 40d is formed in the region 13c.

In the second metal wiring layers 40a and 40b formed in this manner, it has been confirmed that each of the through holes 57, 58 and 59 with an aspect ratio of 0.5–5.0 and the length of each edge being 0.2–2.0 µm is filled by the aluminum with good step coverage without creating voids.

Referring to FIG. 1, the interlayer dielectric layer 70, having substantially the same structure as that of the interlayer dielectric layer 50, is formed over the interlayer dielectric layer 50 such that it covers the second metal wiring layers 40a and 40b and the second layer dummy patterns 40c and 40d. The interlayer dielectric layer 70 is formed under the same conditions used for forming the interlayer dielectric layer 50.

A through hole 71 for exposing the second metal wiring layer 40a and through holes 72 and 73 for exposing the second metal wiring layer 40b are formed in the interlayer dielectric layer 70. The through holes 71, 72 and 73 are formed under the same conditions used for forming the through holes 57, 58 and 59.

Third metal wiring layers 60a and 60b and third layer dummy patterns 60c and 60d are formed over the interlayer dielectric layer 70. The third metal wiring layer 60a is located in the region 13a and is electrically connected to the second metal wiring layer 40a through the through hole 71. The third metal wiring layer 60b is located in the region 13b and is electrically connected to the second metal wiring layer 40b through the through hole 72 and 73.

In the present embodiment, the first layer dummy patterns 20c and 20d are formed at the same time when the first metal wiring layers 20a and 20b are formed. The second layer dummy patterns 40c and 40d are formed at the same time when the second metal wiring layers 40a and 40b are formed. The third layer dummy patterns 60c and 60d are formed at the same time when the third metal wiring layers 60a and 60b are formed. The present invention is not limited to this embodiment, and they may be separately formed.

In accordance with the present embodiment, the first silicon oxide film 54 that contains silanol is formed by reacting $SiH_4$ and $H_2O_2$ through a CVD method. As a result, the interlayer dielectric layers 50 and 70, having an excellent planarization characteristic, are formed. Accordingly, process margins in processes including wiling layer processing are improved, and the manufacturing quality and yield are improved.

In particular, when the interlayer dielectric layer 50 is formed between the main surface of the silicon substrate 11 and the first metal wiring layers 20a and 20b and the first layer dummy patterns 20c and 20d (i.e., at a location where the interlayer dielectric layer 30 is formed), the following effects are achieved. The interlayer dielectric layer 50 is planarized at substantially lower temperatures compared to the reflow temperature in forming a conventional BPSG film. As a result, device characteristics against punch-through and junction leaks are improved, and further device miniaturization of devices with highly reliable contact structures is achieved. Also, it is advantageous in view of the manufacturing process.

In accordance with the present embodiment, at least a degasification process and a cooling process are conducted before sputtering aluminum films and, preferably, the aluminum films are continuously formed in the same chamber. As a result, through holes having an aperture diameter of about 0.2 µm can be filled only with aluminum or an aluminum alloy, and therefore the device reliability and production yield are improved. Also, it has been confirmed that the aluminum films forming the contact section do not have partial precipitation of copper or abnormal growth of crystal grains and are highly reliable in various aspects, including migration and the like.

In the present embodiment, it is believed that the first and second aluminum films 42 and 43 are embedded well in the through holes, due to the following reasons, in addition to the reasons described above with respect to the shape of the through holes.

(a) By performing the degasification process, water and nitrogen contained in the interlayer dielectric layer 50 (the interlayer dielectric layer 70) are gasified and sufficiently discharged. As a result, generation of gases from the interlayer dielectric film 50 and the wetting layer 41 is prevented, when the first aluminum film 42 is formed in later steps. As a consequence, the wetting layer 41 and the first aluminum film 42 can be formed with high coherency and, therefore, good step coverage.

(b) The substrate temperature is set at a relatively low temperature, that is, 200° C. or lower, when the first aluminum film 42 is formed. As a result, water and nitrogen contained in the interlayer dielectric layer 50 and the wetting layer 41 are prevented from being discharged, with the result that the coherency of the first aluminum film 42 is further increased in addition to the effect provided by the degasification process.

(c) Further, the first aluminum film 42 itself plays a role in restricting generation of gasses from the underlying layers when the substrate temperature rises. As a result, the second aluminum film 43 can be formed at a relatively high temperature and, therefore, flow and diffusion can be optimally conducted for the second aluminum film 43.

The present invention is not limited to the embodiments described above and can be modified as follows.

In the present embodiment, when the second silicon oxide film 56 is formed by a plasma CVD method, nitrogen monoxide is used as a compound including oxygen. In an alternative embodiment, ozone may be used instead. The wafer may preferably be exposed to an ozone atmosphere before the second silicon oxide film 56 is formed.

Figure 12:
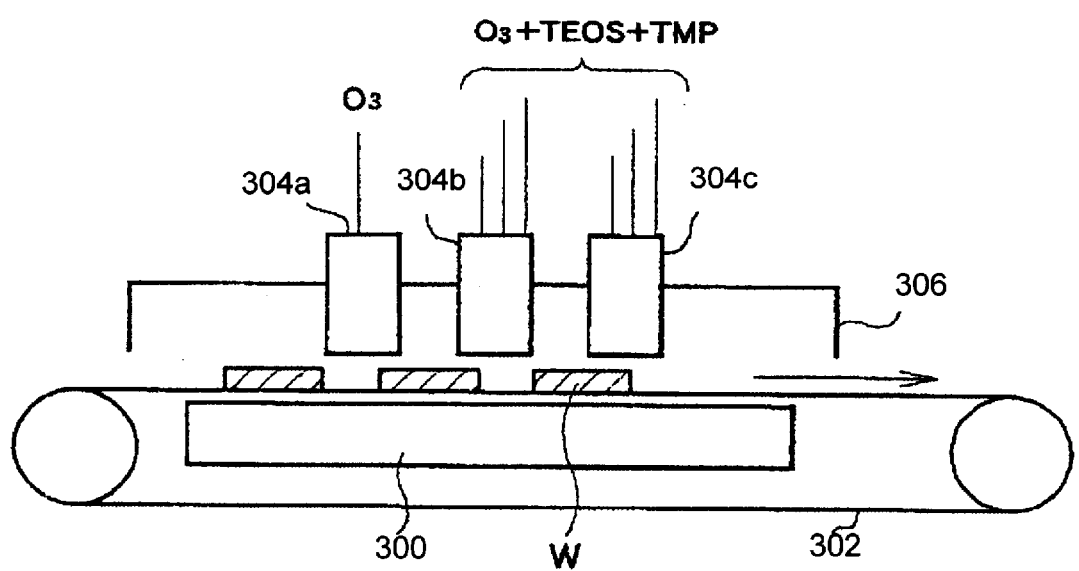
FIG. 12 schematically shows a belt furnace system used for manufacturing the embodiment described.

For example, a belt furnace having a heater 300 shown in FIG. 12 is employed. A wafer W is placed on a conveyor belt 302 that is heated at about 400–500° C. by the heater 300 and conveyed at a predetermined transfer speed. In this instance, ozone is supplied through a first gas head 304a, such that the wafer W is transferred in an ozone atmosphere containing about 2–8 weight % ozone for a time period of 5 minutes or longer. Then, ozone, TEOS and TMP ($P(OCH_3)_3$) are supplied through second and third gas heads 304b and 304c under a generally normal pressure to form a PSG film (the second silicon oxide film) 60 to a film thickness of about 100–600 nm with a concentration of about 3–6 weight % phosphorous contained therein. Reference numeral 306 in FIG. 12 denotes a cover.

By using ozone instead of nitrogen monoxide, a silicon oxide film can be formed with TEOS by a normal pressure CVD. Also, by the use of a belt furnace, film formation steps are successively and effectively conducted.

Also, by exposing the wafer W to an ozone atmosphere, it has been confirmed by a thermal desorption spectroscopy (TDS) and a Fourier-transform infrareds spectroscopy (FTIR) that the first silicon oxide film 54 has a low moisture absorption characteristic and contains a sufficiently low level water content. Further, the interlayer dielectric layer 50 has a good planarization characteristic comparable to the one formed by using nitrogen monoxide as a reactive gas. Also, it has been confirmed that the first silicon oxide film 54 does not generate cracks.

In the present embodiment, a silicon oxide film as the third silicon oxide film 52 is formed by a plasma CVD using TEOS. Other types of silicon oxide films may be used instead (in particular, when it is located at a position where the interlayer dielectric layer 30 is formed). For example, as the third silicon oxide film, a film may be formed by a high-temperature reduced-pressure thermal CVD using monosilane and nitrogen monoxide. The silicon oxide film thus formed faithfully follows the surface contour of the underlying layer and has a high degree of coverage characteristic. The film thus formed is dense and therefore has a high passivation characteristic. Also, cracks are difficult to occur in the first silicon oxide film 54 even when anneal temperature is rapidly raised in an anneal treatment. Further, the thermal CVD method provides an advantage in that plasma damages are not caused. The "high-temperature" refers to a temperature ranging from 700 to 850° C. in this embodiment.

In the present embodiment, the interlayer dielectric layer 50 consists of three layers of silicon oxide films. The present invention is not limited to this structure, and other silicon oxide films may be added. For example, a PSG film (with a concentration of 1–6 weight % phosphorous contained therein) may be formed to a film thickness of 100–300 nm by a plasma CVD between the third silicon oxide film 52 and the first silicon oxide film 54. It has been confirmed that the gettering function against mobile ions is further improved by inserting the PSG film. Also, by the insertion of the PSG film, internal stresses of the third silicon oxide film 52 that affect the first silicon oxide film 54 are reduced, and internal stresses of the first silicon oxide film 54 that affect the third silicon oxide film 52 are reduced.

For example, when the second silicon oxide film 56 has a sufficiently high level of planarization, a thick silicon oxide film may be formed on the second silicon oxide film 56, and the thick silicon oxide film is further planarized by chemical-mechanical polishing (CMP).

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A semiconductor device having a first region, a second region and a border region between the first region and the second region, the semiconductor device comprising:
   an interlayer dielectric layer covering at least the first region and the second region;
   a first wiring layer located in the first region, the first wiring layer defining a relatively small pattern;
   a second wiring layer located in the second region, the second wiring layer defining a larger pattern larger than the small pattern;
   a first dummy pattern formed in the first region; and
   a second dummy pattern formed in the border region,
   wherein the interlayer dielectric layer includes a planarization silicon oxide film, the thickness of the interlayer dielectric layer located over the first wiring layer is smaller than the thickness of the interlayer dielectric layer located over the second wiring layer such that a global height difference occurs in the border region between the first region and the second region.

2. A semiconductor device according to claim 1, wherein a minimum distance between the first wiring layer and the first dummy pattern, a minimum distance between the first wiring layer and the second dummy pattern, and a minimum distance between the second wiring layer and the second dummy pattern are respectively a minimum processing dimension for manufacturing the semiconductor device.

3. A semiconductor device according to claim 1 or claim 2, wherein
   a maximum distance between the first wiring layer and the first dummy pattern, a maximum distance between the first wiring layer and the second dummy pattern, and a maximum distance between the second wiring layer and the second dummy pattern are respectively a wiring layer width on a design rule for the semiconductor device.

4. A semiconductor device according to claim 1, wherein the planarization silicon oxide film is one of a silicon oxide film formed by a polycondensation reaction between a silicon compound and hydrogen peroxide, an organic SOG (Spin On Glass) film, an inorganic SOG film and a silicon oxide film formed by reacting an organic silane with ozone or water.

5. A semiconductor device according to claim 1, wherein at least one of a logic circuit, an analog circuit and a memory circuit is formed in the first region, and at least one of a bonding pad, a power source line and a test pattern is formed in the second region.

6. A method for generating pattern data for the first and second dummy patterns provided in the semiconductor device recited in claim 1, the method for generating pattern data comprising the steps of:
   generating pattern data for the first and second wiring layers;
   generating first expanded pattern data representing an expanded pattern of the first wiring layer only in two directions, one of the directions being along a distance between the first wiring layer and the first dummy pattern and the other of the directions being along a distance between the first wiring layer and the second dummy pattern;
   generating second expanded pattern data representing an expanded pattern of the second wiring layer only along a distance between the second wiring layer and the second dummy pattern; and
   reversing the first and second expanded pattern data.

7. A method for generating pattern data for dummy patterns provided in a semiconductor device comprising a first region, a second region, a border region between the first region and the second region, an interlayer dielectric layer covering at least the first region and the second region, a first wiring layer located in the first region and defining a relatively small pattern, a second wiring layer located in the second region and defining a relatively large pattern, a first dummy pattern formed in the first region, and a second dummy pattern formed in the border region, the method for generating pattern data comprising the steps of:

generating pattern data representing patterns for the first and second wiring layers;

determining a first distance between the first wiring layer and the first dummy pattern and a second distance between the second wiring layer and the second dummy pattern;

generating first expanded pattern data representing an expanded pattern of the first wiring layer in which the pattern for the first wiring layer is expanded by the first distance in at least one direction being along the distance between the first wiring layer and the first dummy pattern;

generating second expanded pattern data representing an expanded pattern of the second wiring layer in which the pattern for the second wiring layer is expanded by the second distance in one direction being along the distance between the second wiring layer and the second dummy pattern; and reversing the first expanded pattern data and the second expanded pattern data.

8. A method for generating pattern data according to claim 7, wherein the pattern for the first wiring layer defines two sides facing respectively the first dummy pattern and the second dummy pattern, wherein, in the step of generating the first expanded pattern data, the pattern for the first wiring layer is expanded by the first distance in each of the two directions.

* * * * *